US009379242B1

United States Patent
Lin et al.

(10) Patent No.: US 9,379,242 B1
(45) Date of Patent: Jun. 28, 2016

(54) METHOD OF FABRICATING FIN FIELD EFFECT TRANSISTOR

(71) Applicant: UNITED MICROELECTRONICS CORP., Hsin-Chu (TW)

(72) Inventors: Mon-Sen Lin, Ping-Tung County (TW); Yu-Ping Wang, Taoyuan (TW); Yu-Ting Tseng, Tainan (TW); Hao-Yeh Liu, Kaohsiung (TW); Chun-tsen Lu, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/723,476

(22) Filed: May 28, 2015

(51) Int. Cl.
| H01L 21/4763 | (2006.01) |
| H01L 29/78 | (2006.01) |
| H01L 29/66 | (2006.01) |
| H01L 29/10 | (2006.01) |
| H01L 27/088 | (2006.01) |
| H01L 21/8238 | (2006.01) |
| H01L 21/8234 | (2006.01) |

(52) U.S. Cl.
CPC ...... *H01L 29/7847* (2013.01); *H01L 29/66545* (2013.01); *H01L 29/66795* (2013.01); *H01L 21/823431* (2013.01); *H01L 21/823821* (2013.01); *H01L 27/0886* (2013.01); *H01L 29/1054* (2013.01)

(58) Field of Classification Search
CPC ............... H01L 29/7847; H01L 29/66545; H01L 29/66795
USPC ........................................................ 438/591
See application file for complete search history.

(56) References Cited

U.S. PATENT DOCUMENTS

| 8,193,049 | B2 | 6/2012 | Golonzka | |
| 8,779,477 | B2 | 7/2014 | Weber | |
| 2007/0122984 | A1 | 5/2007 | Zhu | |
| 2013/0049141 | A1* | 2/2013 | Cheng | ................ H01L 29/4966 257/412 |
| 2013/0115742 | A1* | 5/2013 | Kim | ................... H01L 21/26506 438/198 |
| 2013/0134506 | A1 | 5/2013 | Yagishita | |
| 2013/0200455 | A1 | 8/2013 | Lo | |
| 2013/0200468 | A1 | 8/2013 | Cai | |
| 2014/0131812 | A1* | 5/2014 | Wu | ................. H01L 21/823418 257/401 |
| 2015/0162445 | A1* | 6/2015 | Wu | ..................... H01L 29/7848 257/344 |

OTHER PUBLICATIONS

Leland Chang, CMOS Circuit Performance Enhancement by Surface Orientation Optimization, 2004 IEEE, Oct. 2004.

* cited by examiner

*Primary Examiner* — Tod T Van Roy
*Assistant Examiner* — Vu A Vu
(74) *Attorney, Agent, or Firm* — Winston Hsu; Scott Margo (57) ABSTRACT

A method of fabricating a fin field effect transistor including providing a substrate having at least one fin structure, a dummy gate, and an internal dielectric layer thereon, removing the dummy gate to form a gate trench on the fin structure, blanketly forming a stress film on the substrate to cover a surface of the gate trench, performing a thermal annealing process, removing the stress film, and forming a metal gate is in the gate trench.

16 Claims, 15 Drawing Sheets

METHOD OF FABRICATING FIN FIELD EFFECT TRANSISTOR

BACKGROUND OF THE INVENTION

1. Field of the Invention

The present invention relates to a method of fabricating a fin field effect transistor (finFET), and more particularly, to a method of fabricating a finFET having strained channel region.

2. Description of the Prior Art

As semiconductor devices switching speeds continuing to increase and operating voltage levels continue to decrease, the performances of metal-oxide-semiconductor filed effect transistors (MOSFETs) and other types of transistors, need to be correspondingly improved. Currently, along with the development of the MOSFETs, one of the main goals is to increase the carrier mobility so as to further increase the operation speed of the MOSFETs.

In general, a MOSFET is disposed on a semiconductor substrate, which has at least a gate structure, a source region, a drain region separately disposed on two sides of the gate structure and a channel region disposed in the semiconductor substrate right below the gate structure. When a voltage with a certain value is applied to the gate structure, the resistance of the channel region decreases correspondingly, due to the induced capacitance effect and to the carriers that are able to flow between the source region and the drain region freely. In theory, it is well-known that the mobility of carriers flowing in the channel region can be affected by a lattice structure within the channel region. In order to get benefits from this phenomenon, in the current fabrication processes, a stress layer will be formed on a semiconductor substrate to cover a corresponding gate structure, a source region and a drain region, so as to transfer or apply the inherent stress to the predetermined channel region disposed below the gate structure. However, to carry out a heat treatment process is necessary for the stress transferring process, and this process will bring heat effect to the device on the semiconductor substrate, inducing process variation and side effect. In addition, since there is still a gate structure disposed between the stress layer and the predetermined channel region, the effect of stress transferring process is limited. As a result, it is still an important issue for the manufacturer to provide a method of fabricating FET that the inherent stress of the stress layer can be directly transferred to the corresponding channel region more effectively without inducing process variation.

SUMMARY OF THE INVENTION

One objective of the present invention is to provide a method of fabricating a finFET with a stressed or strained channel by performing the SMT process after removing the dummy gate.

To address these and other objectives, according to one embodiment of the invention, a method of fabricating a fin field effect transistor is provided, which includes the following processes. First, a substrate having at least one fin structure, a dummy gate, and an internal dielectric (ILD) layer thereon is provided, wherein the dummy gate covers a portion of the fin structure. Then, the dummy gate is removed to form a gate trench on the fin structure. After that, a stress film is blanketly formed on the substrate to cover a surface of the gate trench and a top surface of the fin structure. A thermal annealing process is then performed, and the stress film is following removed. After that, a metal gate is formed in the gate trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-15 are schematic drawings illustrating the method of fabricating a finFET according to a first embodiment of the present invention, wherein

FIGS. 12-15 are schematic drawings illustrating the method of fabricating a finFET according to a second embodiment of the present invention, wherein

DETAILED DESCRIPTION

Figure 1:
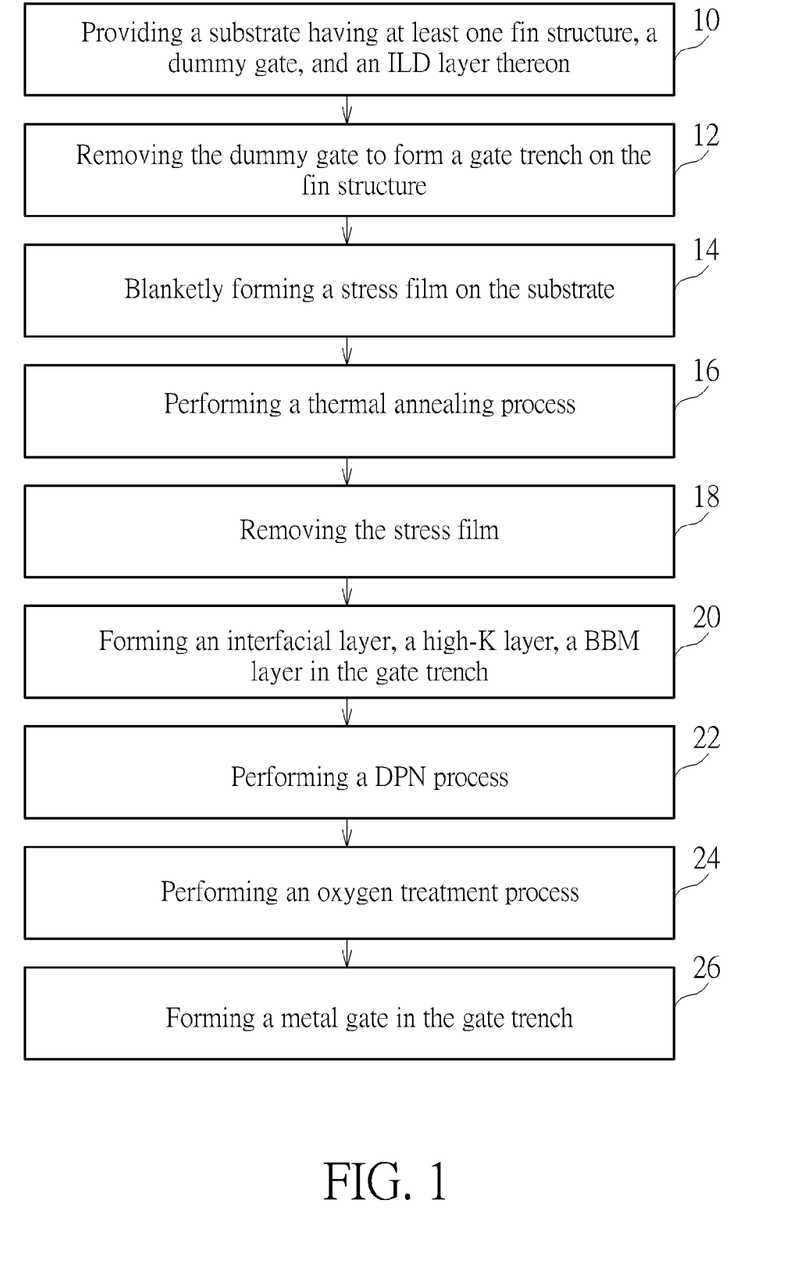
FIG. 1 is a flow chart illustrating a method of fabricating a finFET according to a first embodiment of the present invention.
Figure 2:
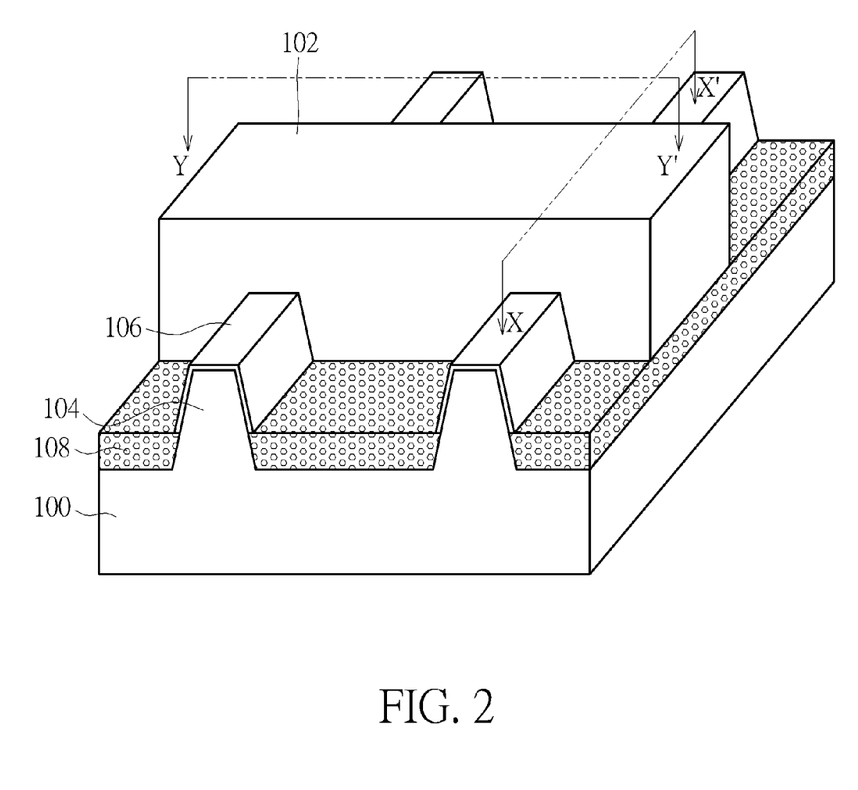
FIG. 2 is a schematic three dimensional drawing of the devices mentioned in the first embodiment.
Figure 3:
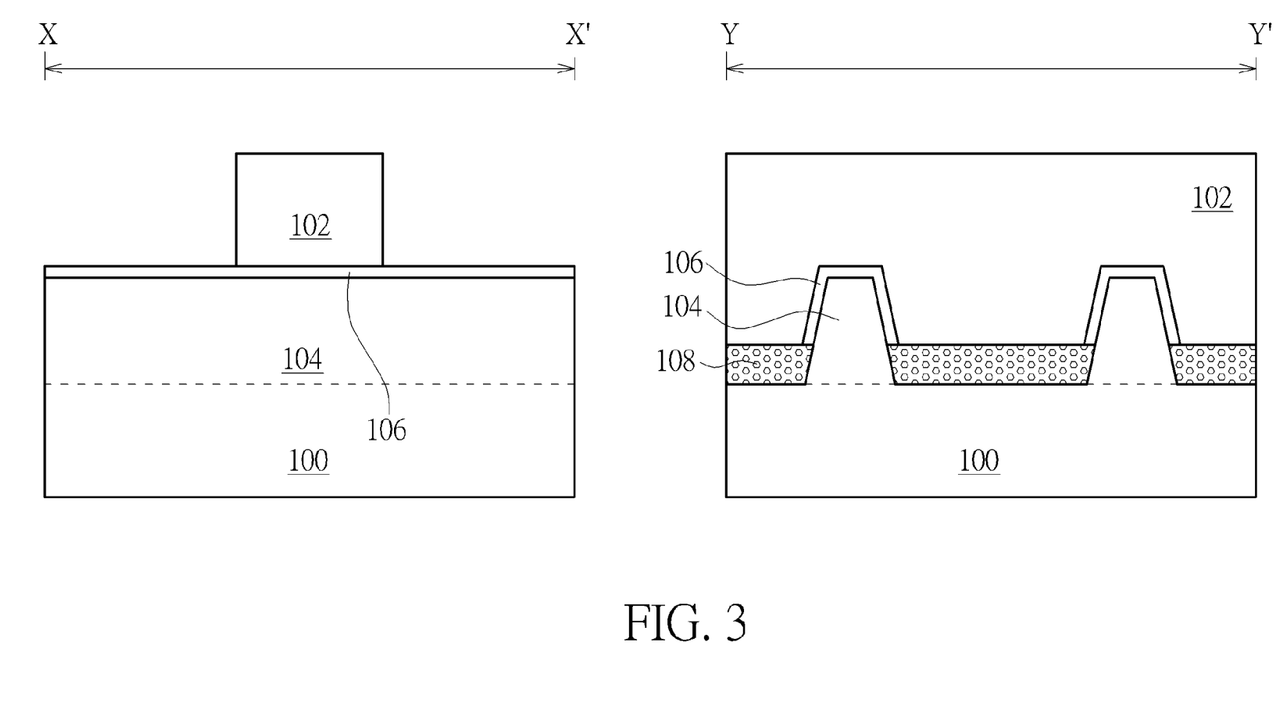
FIG. 3 is a schematic drawing of cross-sectional views of the devices shown in FIG. 2.

Please refer to FIG. 1 and FIGS. 2-10, wherein FIG. 1 is a flow chart illustrating a method for fabricating a finFET according to a first embodiment provided by the present invention, and FIGS. 2-10 are schematic drawings illustrating the method for fabricating a finFET according to the first embodiment of the present invention. As shown in FIG. 1, the present invention provides to perform STEP 10: providing a substrate having at least one fin structure, a dummy gate, and an ILD layer thereon, wherein the dummy gate covers a portion of the fin structure. Referring to FIGS. 2-3, a substrate 100 is first provided, wherein FIG. 3 shows the cross-sectional view along the cross line X-X' and the cross line Y-Y' of FIG. 2. The substrate 100 has at least one fin structure 104, wherein two fin structures 104 are shown for illustration in FIGS. 2-3. The substrate 100 may be, for example, a silicon substrate, a silicon-containing substrate, a III-V group-on-silicon (such as GaN-on-silicon) substrate or a graphene-on-silicon substrate, but not limited thereto. An isolation structure 108 (ex. an oxide layer) may be formed between each of the fin structures 104 by successively performing a deposition, a planarization, and an etching back process. As shown in FIG. 2, the isolation structure 108 may be formed between each fin structures 104 parallel to each other, thus good isolation may be provided for the devices formed in following process. In addition, a gate insulating layer 106 and a dummy gate 102 are disposed on the surface of the substrate 100, covering a portion of the fin structures 104, wherein the gate insulating layer 106 is disposed between the fin structures 104 and the dummy gate 102. The dummy gate 102 may be formed by a patterned polysilicon layer. The gate insulating layer 106 may be composed of oxide layer, for instance. Although the gate insulating layer 106 covers the top surface of the fin structures 104 in FIGS. 2-3, it may be selectively removed from the top surface of the exposed fin structures 104 when patterning the polysilicon layer for forming the dummy gate 104 in other variant embodiment, which means no gate insulating layer 106 will be left on the surface of the exposed fin structures 104.

Figure 4:
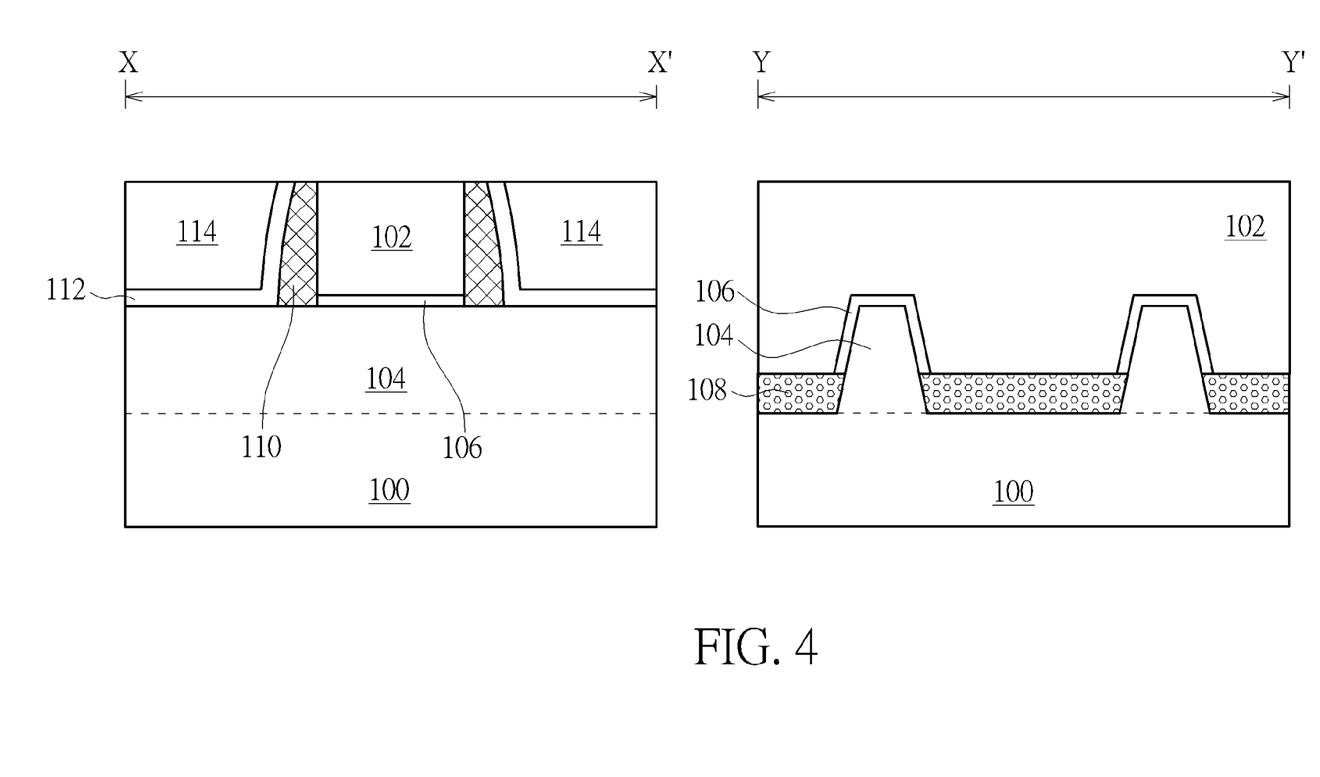
FIG. 4 is a schematic drawing in a step subsequent to FIG. 3.

Then, referring to FIG. 4, after removing the gate insulating layer 106 not covered by the dummy gate 102, a spacer 110, source and drain regions (not shown), a contact etch stop layer (CESL) 112, and an ILD layer 114 are sequentially formed on the substrate 100. The spacer 110 is formed on the sidewall of the dummy gate 102, by depositing a material layer and then performing a dry etching process to said material layer, for instance. The CESL 112 may include nitride silicon material, but not limited to. The source and drain regions may be formed through a heavy doping process in the fin structure 104 near the spacer 110. The ILD layer 114 may be formed by depositing a dielectric material layer and a chemical mechanism polishing (CMP) process to remove the excessive dielectric material layer higher than the dummy gate 102. In this embodiment, the dummy gate 102 are exposed by the ILD layer 114, as shown in the Y-Y' section part in FIG. 4.

Figure 5:
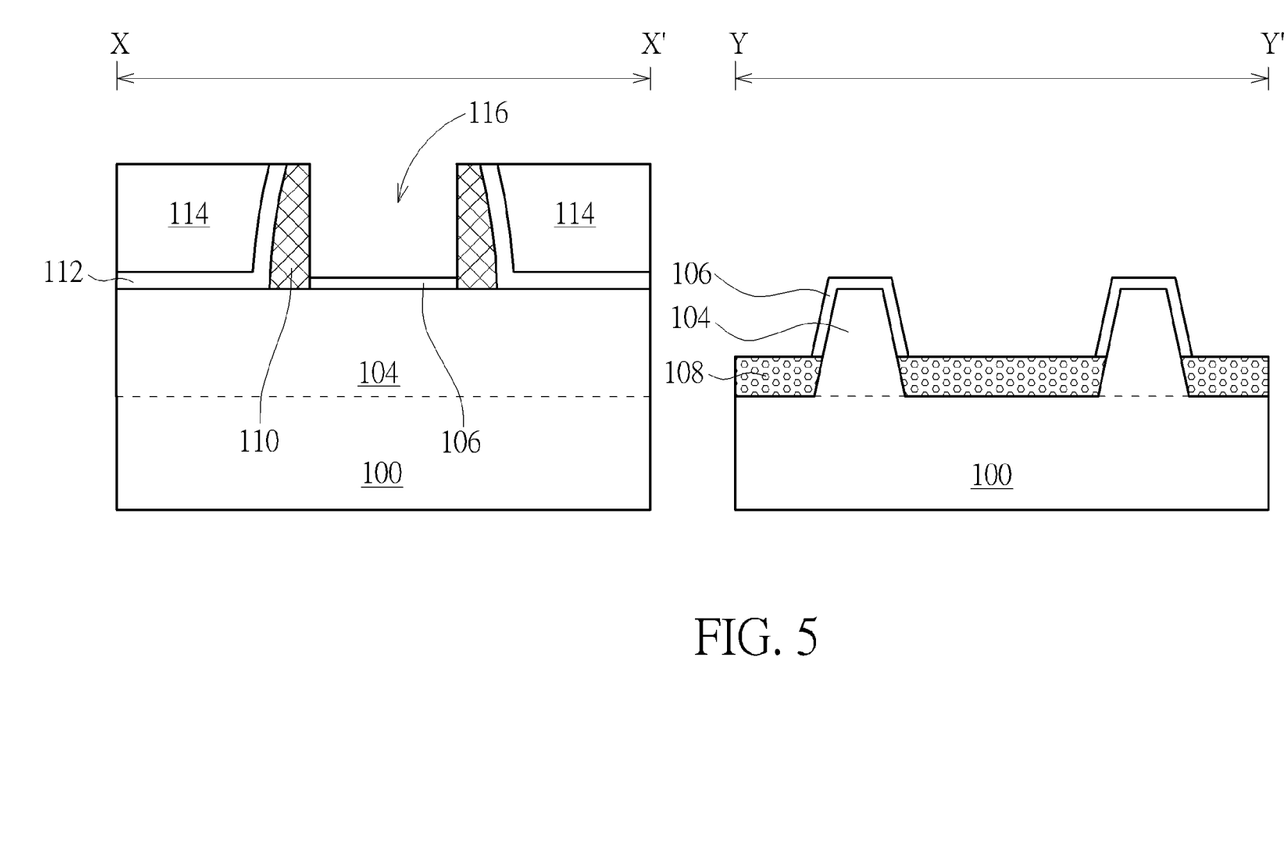
FIG. 5 is a schematic drawing in a step subsequent to FIG. 4.

Please refer to FIG. 1 and FIG. 5. The present invention then provides to perform STEP 12: removing the dummy gate to form a gate trench on the fin structure. As shown in FIG. 5, a dummy gate removal process is than carried out to remove the dummy gate 102 shown in FIG. 4. In this dummy gate removal process, a dry etching process may be performed to remove the majority of polysilicon from the dummy gate 102, and a wet etching may be further conducted to remove the remaining dummy gate 102. After the dummy gate 102 is removed, a gate trench 116 is formed between the spacers 110, above the exposed fin structures 104, and the gate insulating layer 106 is remained in the gate trench 116.

Figure 6:
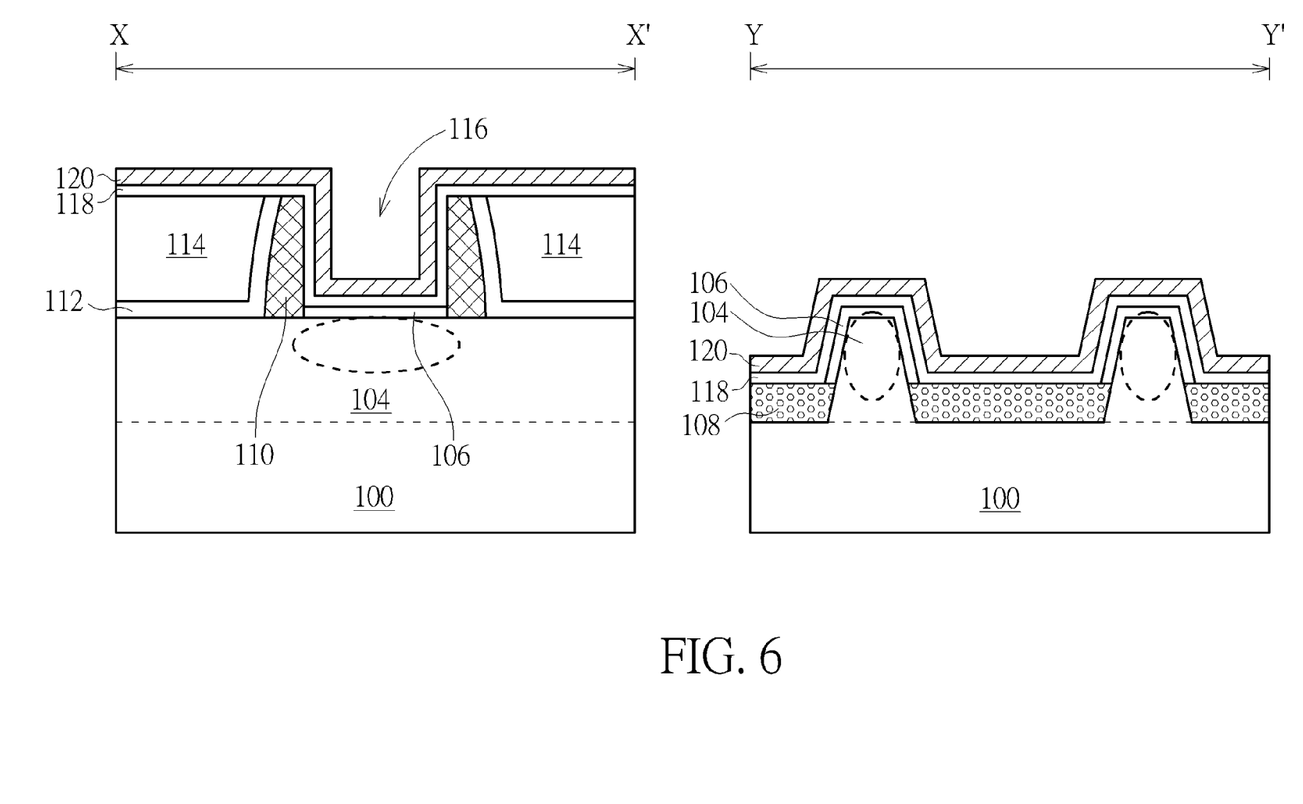
FIG. 6 is a schematic drawing in a step subsequent to FIG. 5.

Referring to FIG. 6, the present invention then provides to perform STEP 14: blanketly forming a stress film on the substrate. A stress film 120 is blanketly formed on the substrate 100 to cover the surface of the gate trench 116 and the top surfaces of the fin structures 104. The stress film 120 may be, but not limited to, a silicon nitride layer, and may be formed through a deposition processes, such as a plasma-enhanced chemical vapor deposition (PECVD) process, a sub-atmospheric pressure chemical vapor deposition (SACVD) process, and a high-density plasma chemical vapor deposition (HDCVD) process. In addition, optionally, a buffer layer 118 may be conformally formed on the surface of the substrate 100 before forming the stress film 120 in order to enhance the adhering of the stress film 120 or to protect the spacer 110 and other device on the substrate 100 in the subsequent process. The processes for forming the buffer layer 118 may include a CVD process or a high temperature oxidation process, but not limited thereto. The buffer layer 118 is, but not limited to, a silicon oxide layer in this embodiment. It is worth noting that the buffer layer 118 is not a necessary element for the present invention, and the process of forming the buffer layer 118 can be omitted if required.

Next, STEP 16 shown in FIG. 1 is performed to carry out a thermal annealing process. The thermal annealing process is subsequently carried out for conducting a stress memorization technique (SMT) process to the fin structures 104. The annealing process may be performed between 580° C. to 850° C., but not limited thereto. The silicon atoms in the fin structures 104 will be re-crystallized according to the tensile/compressive directions that the stress film 120 provides, so as to form a strained channel region (marked by the dotted circle in FIG. 6) below the gate trench 116. It is noteworthy that when the predetermined formed finFET is an N type finFET, the strained channel is a tensile strain channel, and when the predetermined formed finFET is a P type finFET, the strained channel is a compressive strain channel. In this embodiment, the predetermined formed finFET is an N type finFET, and the stress film 120 formed in STEP 14 is a tensile stress film, which provides a good longitudinal stress of the FET.

Figure 7:
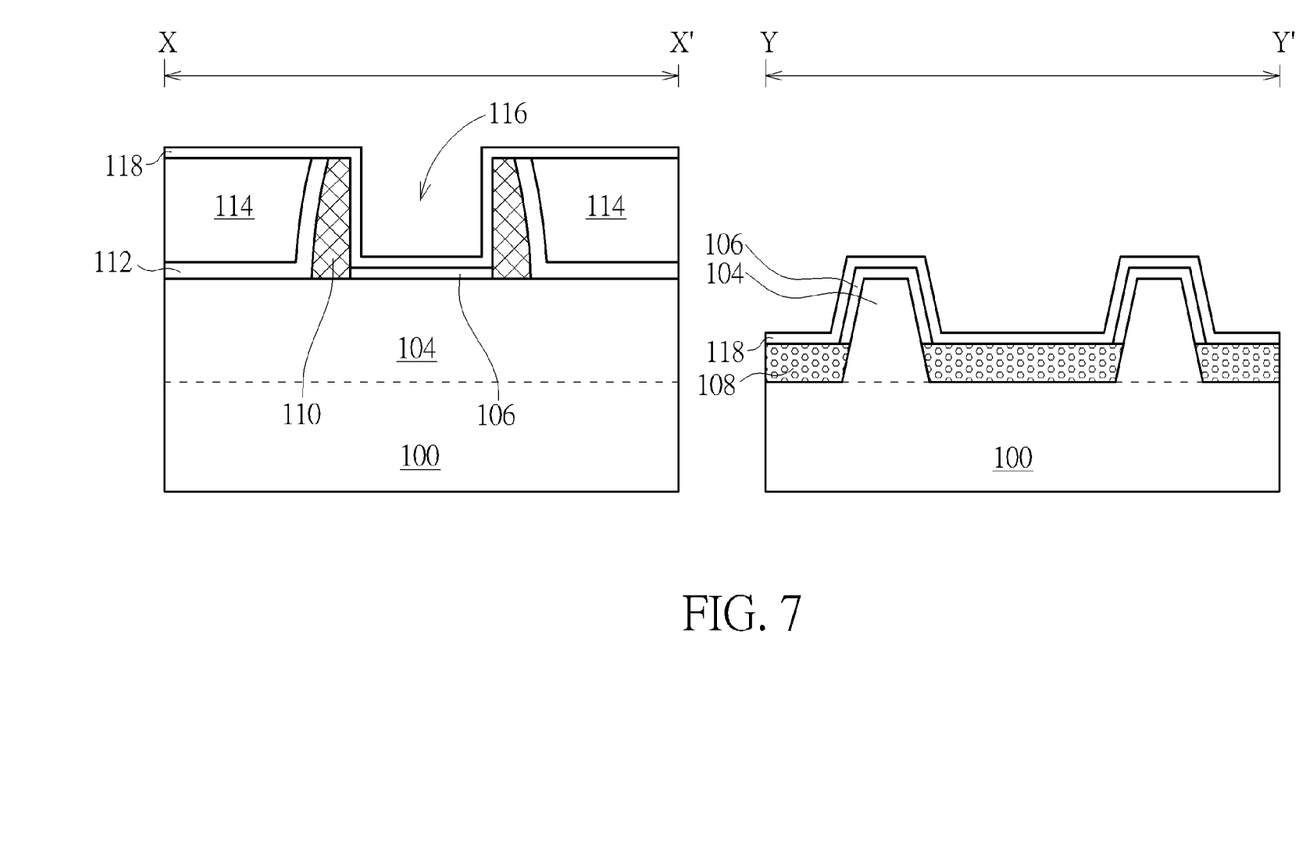
FIG. 7 is a schematic drawing in a step subsequent to FIG. 6.

Please refer to FIG. 1 again and FIG. 7. STEP 18 is then performed after the thermal annealing process. The stress film 120 may be removed through a dry etching process or a wet etching process, while the buffer layer 118 is remained in the gate trench 116 and the top surfaces of the fin structures 104, the spacer 110, and the CESL 112 for providing protection of the above-mentioned devices, as shown in FIG. 7. After that, the buffer layer 118 on the substrate 100 and the gate insulating layer 106 disposed in the bottom surface of the gate trench 116 are removed (not illustrated), thus the fin structures 104 under the gate trench 116 is exposed. It is an advantage that the buffer layer 118 and the gate insulating layer 106 can be removed simultaneously by using the same etchant since they are composed similar materials, thus no extra removal process is needed for the buffer layer 118.

Figure 8:
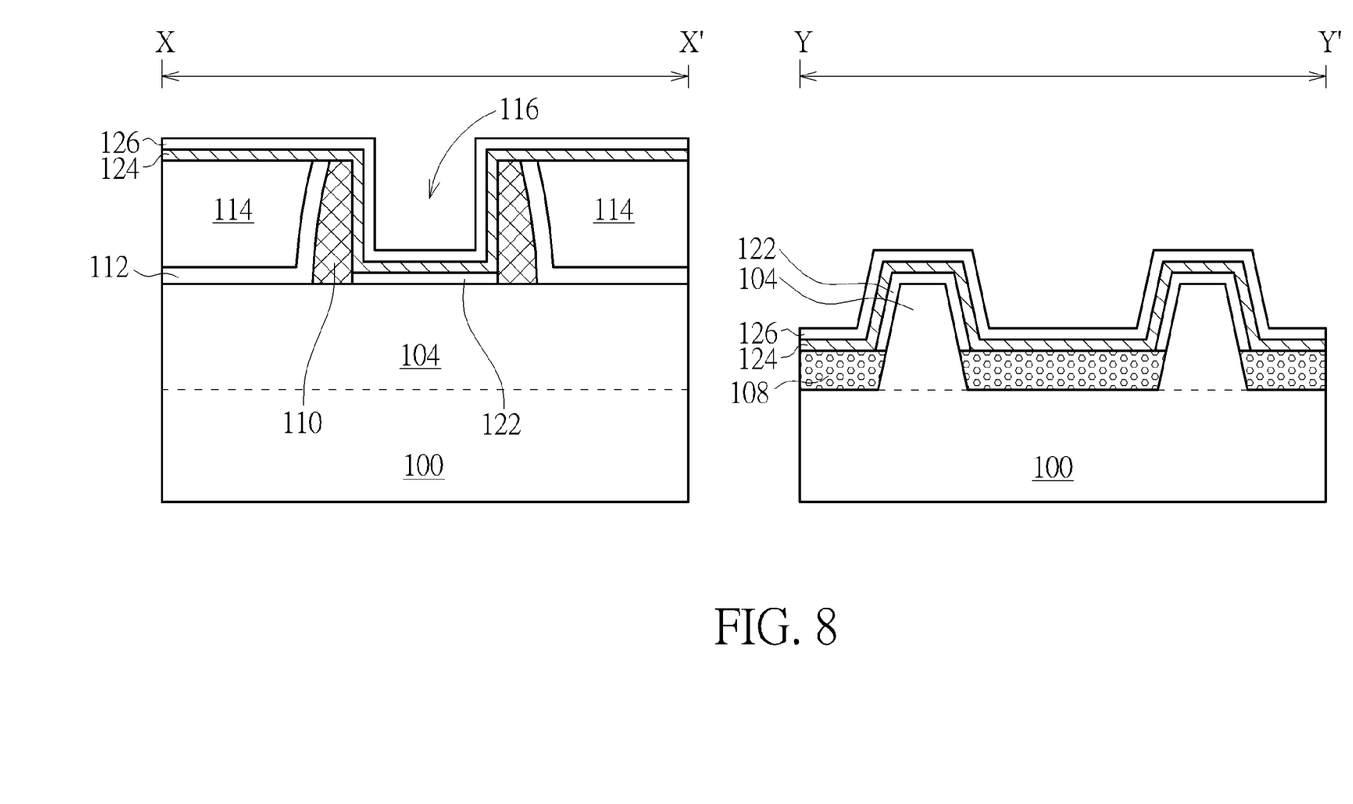
FIG. 8 is a schematic drawing in a step subsequent to FIG. 7.

Please refer to FIG. 1 again and FIG. 8. STEP 20 is then performed to selectively forming an interfacial layer, a high-K dielectric layer, a bottom barrier metal (BBM) layer in the gate trench. As shown in FIG. 8, an interfacial layer 122 is optionally formed in the bottom surface of the gate trench 116 and the top surfaces of the fin structures 104, through an in-situ steam generation (ISSG) process, in which the interfacial layer 122 is composed of silicon oxide and the thickness thereof is around 10 Angstroms for example. One of the main functions of the interfacial layer 122 is to facilitate the adhering between the high-K dielectric layer 124 and the exposed fin structures 104 in a subsequent process. Then, a high-K dielectric layer 124 is then deposited on the interfacial layer 122 and the surface of the spacer 110, the ILD layer 114 and the fin structures 104. The high-K dielectric layer 124 may be formed through an atomic layer deposition (ALD) process. In this embodiment, the high-K dielectric layer 124 could be a single-layer or a multi-layer structure containing metal oxide layer such as rare earth metal oxide, wherein the dielectric constant of the high-K dielectric layer 124 is substantially greater than 20. For example, the high-K dielectric layer 124 could be selected from a group consisting of hafnium oxide ($HfO_2$), hafnium silicon oxide (HfSiO), hafnium silicon oxynitride (HfSiON), aluminum oxide (AlO), lanthanum oxide ($La_2O_3$), lanthanum aluminum oxide (LaAlO), tantalum oxide, $Ta_2O_3$, zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). The thickness of the high-k dielectric layer 124 may be about 20 Angstroms, but not limited thereto. A BBM layer 126 is following formed on the high-K dielectric layer 124. For example, the BBM layer 126 is composed of TiN, but not limited thereto. It should be noted that the formations of the interfacial layer 122, the high-K dielectric layer 124, and the BBM layer 126 are optional and may be omitted in variant embodiments individually. Next, STEP 22 is performed to selectively carry out a decoupled plasma nitridation (DPN) process after forming the BBM layer 126, in order to further treat the interfacial layer 122, the high-K dielectric layer 124 and the BBM layer 126.

Figure 9:
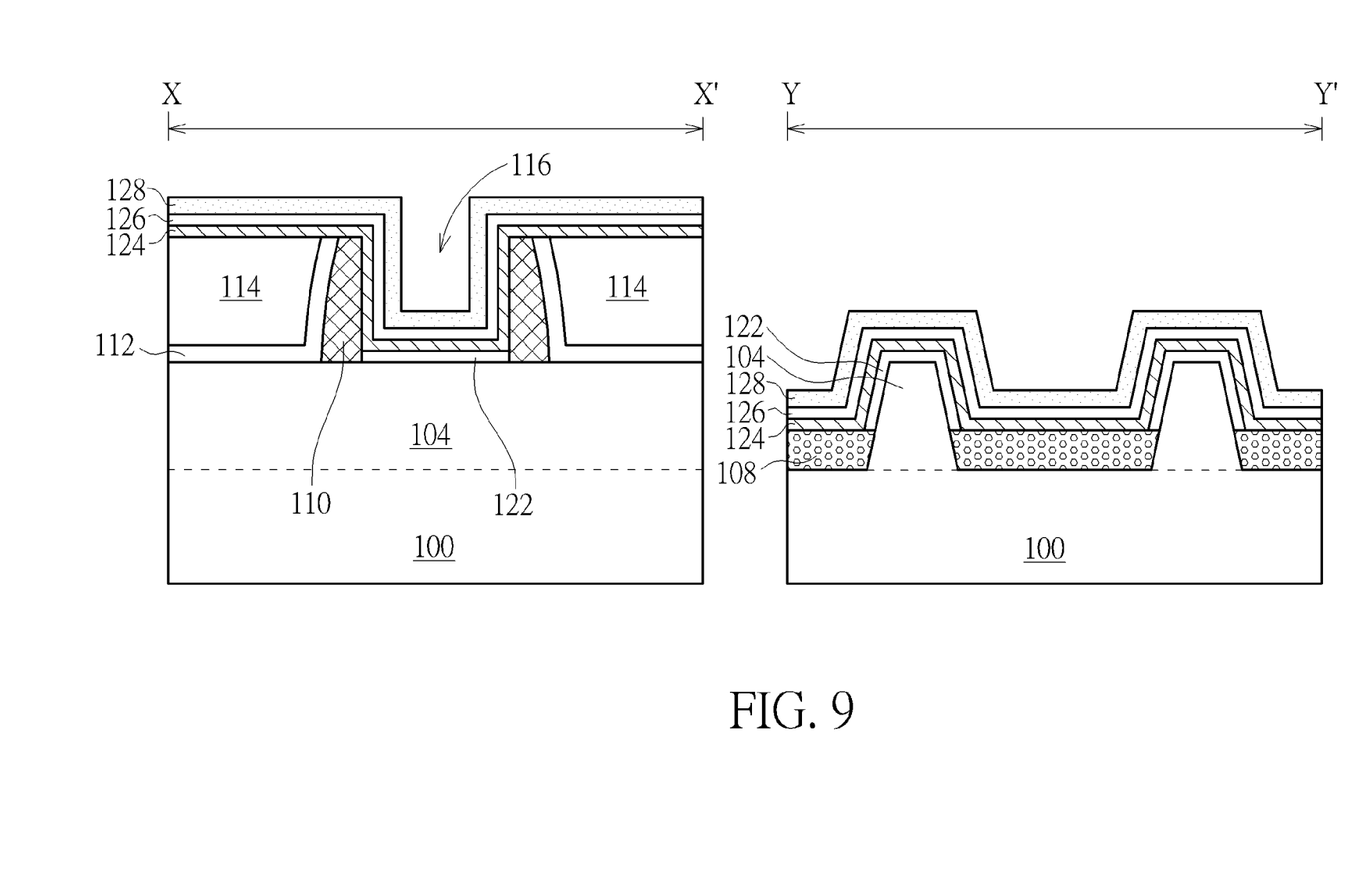
FIG. 9 is a schematic drawing in a step subsequent to FIG. 8.

Please refer to FIG. 1 again and FIG. 9. STEP 24 is then performed to selectively carry out an oxygen treatment process for removing extra oxygen from the BBM layer 126. The oxygen treatment process includes forming an oxygen-absorption material layer 128 in the gate trench 116 and on the top surfaces of the fin structures 104 to cover the BBM layer 126, performing an oxygen absorption process to enable the oxygen-absorption material layer 128 to absorb oxygen from the BBM layer 126, and removing the oxygen-absorption material layer 128. Wherein, the oxygen-absorption material layer 128 may include silicon or carbon materials. In this embodiment, the oxygen-absorption material layer 128 is an amorphous silicon layer, but not limited thereto, and may be deposited through CVD or PVD process to prevent impurities or contaminants from entering the BBM layer 112. The oxygen absorption process may be carried out through a thermal treatment process, such as a thermal annealing process, which may be called as post silicon annealing (PSA) process. After the PSA process, the oxygen-absorption material layer 128 is removed.

Figure 10:
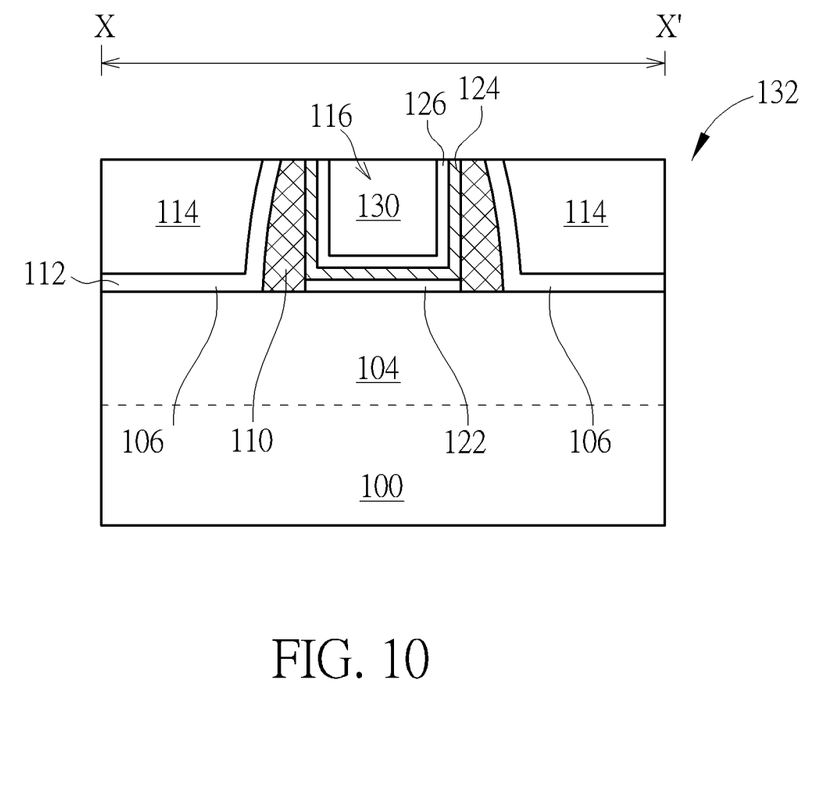
FIG. 10 is a schematic drawing in a step subsequent to FIG. 9.

Please refer to FIG. 1 again and FIG. 10. STEP 26 is performed to form a metal gate in the gate trench. In FIG. 10, only the cross-sectional view of the gate structure portion is shown. A work function metal layer (not shown) may be selectively formed on the substrate 100 to cover the surface of the BBM layer 126. Then, a conductive layer (not shown) with low resistance material is deposited to fill the gate trench 116. Sequentially, one or multiple planarizing process, such as a CMP process is carried out to partially remove the conductive layer and the work function metal layer to form a metal gate 130 in the gate trench 116. It should be noted that the material of the work function metal layer is selected depending on the conductivity type of the finFET. As this approach is well known to those skilled in the art, the details of which are not described herein for sake of brevity. The fabrication of the finFET 130 according to the present invention is complete.

Figure 11:
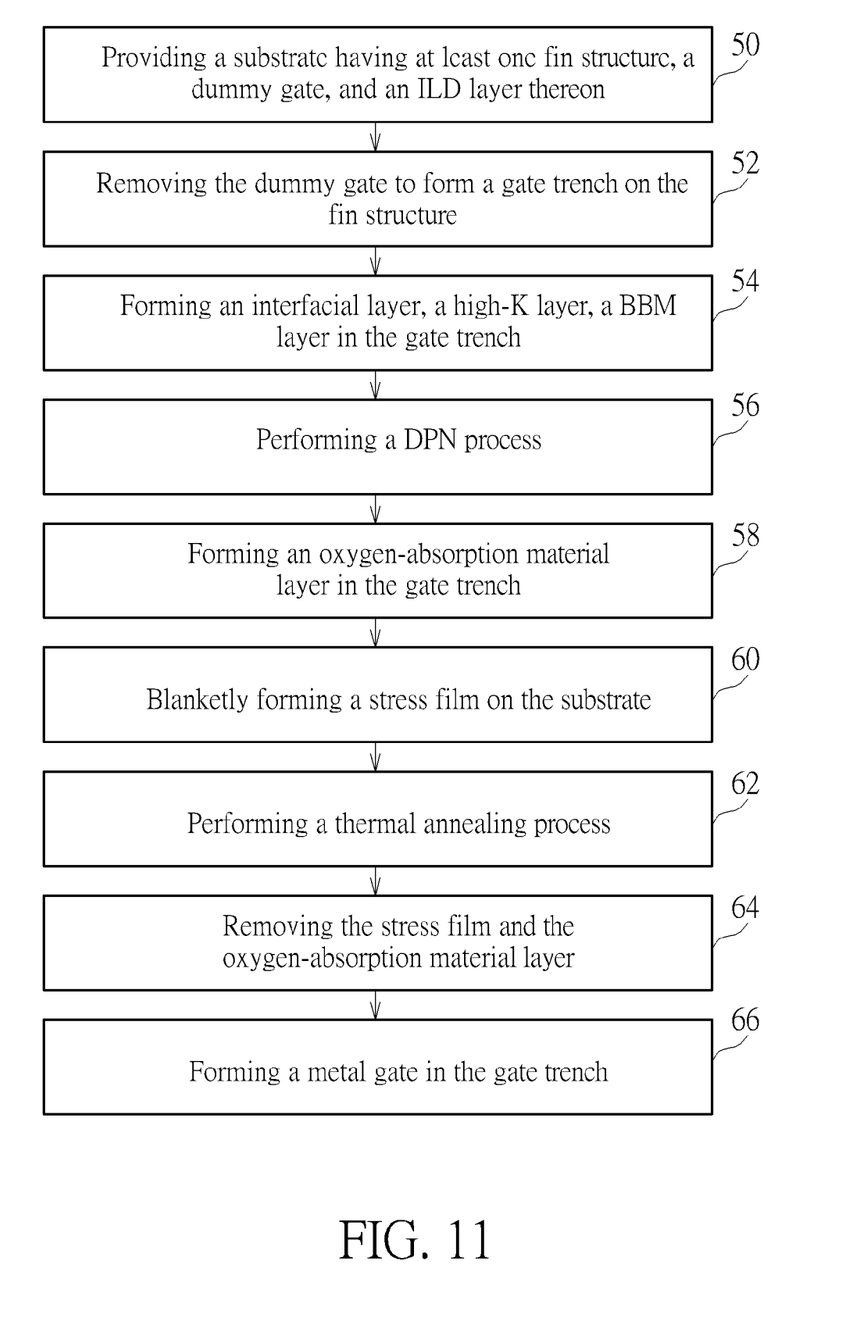
FIG. 11 is a flow chart illustrating a method of fabricating a finFET according to a second embodiment of the present invention.

Please refer to FIGS. 11-15, wherein FIG. 11 is a flow chart of the method of fabricating a finFET according to a second embodiment of the present invention, and FIGS. 12-15 are schematic cross-sectional views of the finFET structure during the fabrication. It should be noted that elements the same in both first and second embodiments can be made of the same materials and trough similar or identify process, therefore those details are omitted herein in the interest of brevity.

Figure 12:
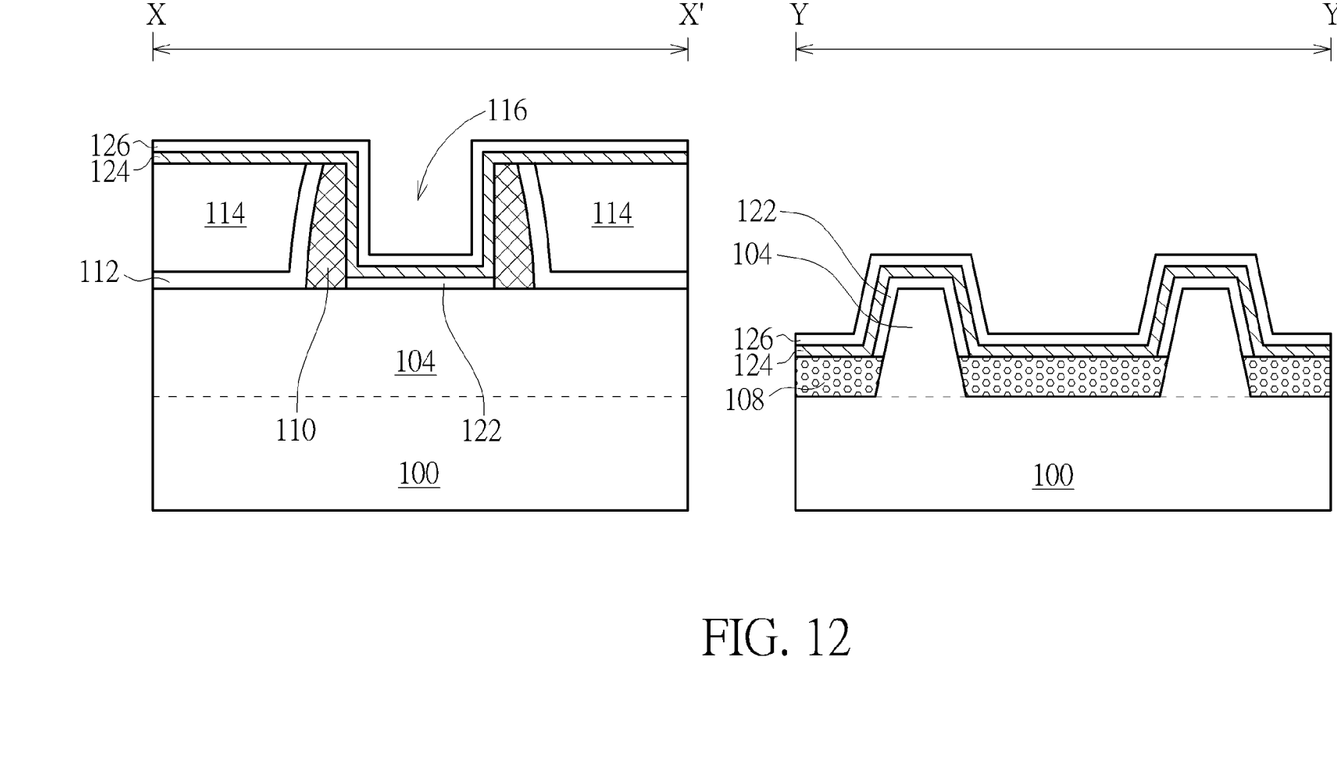
FIG. 12 is a schematic drawing in a step subsequent to FIG. 5.

Please refer to FIG. 11. According to the second embodiment of the present invention, the first two processes, STEP 50 and STEP 52 relates to providing a substrate having at least one fin structure, a dummy gate, and an ILD layer thereon and then to remove the dummy gate to form a gate trench on the fin structure. Since STEP 50 and STEP 52 are the same as STEP 10 and STEP 12 shown in FIG. 1, no details for these processes will be described. After the dummy gate is removed, a gate trench 116 is formed, as shown in FIG. 5. Then, STEP 54 is performed. Please also refer to FIG. 12, wherein FIG. 12 illustrates the device structures following the process of FIG. 5. In STEP 54, the gate insulating layer 106 disposed in the gate trench 116 is removed, so as to expose the surface of the fin structures 104 in the gate trench 116. Then, the interfacial layer 122, the high-K dielectric layer 124, and the BBM layer 126 are selectively deposited on the substrate 100, covering the surfaces of the gate trench 116 and the fin structures 104. Following that, STEP 56 is performed to selectively perform a DPN process.

Figure 13:
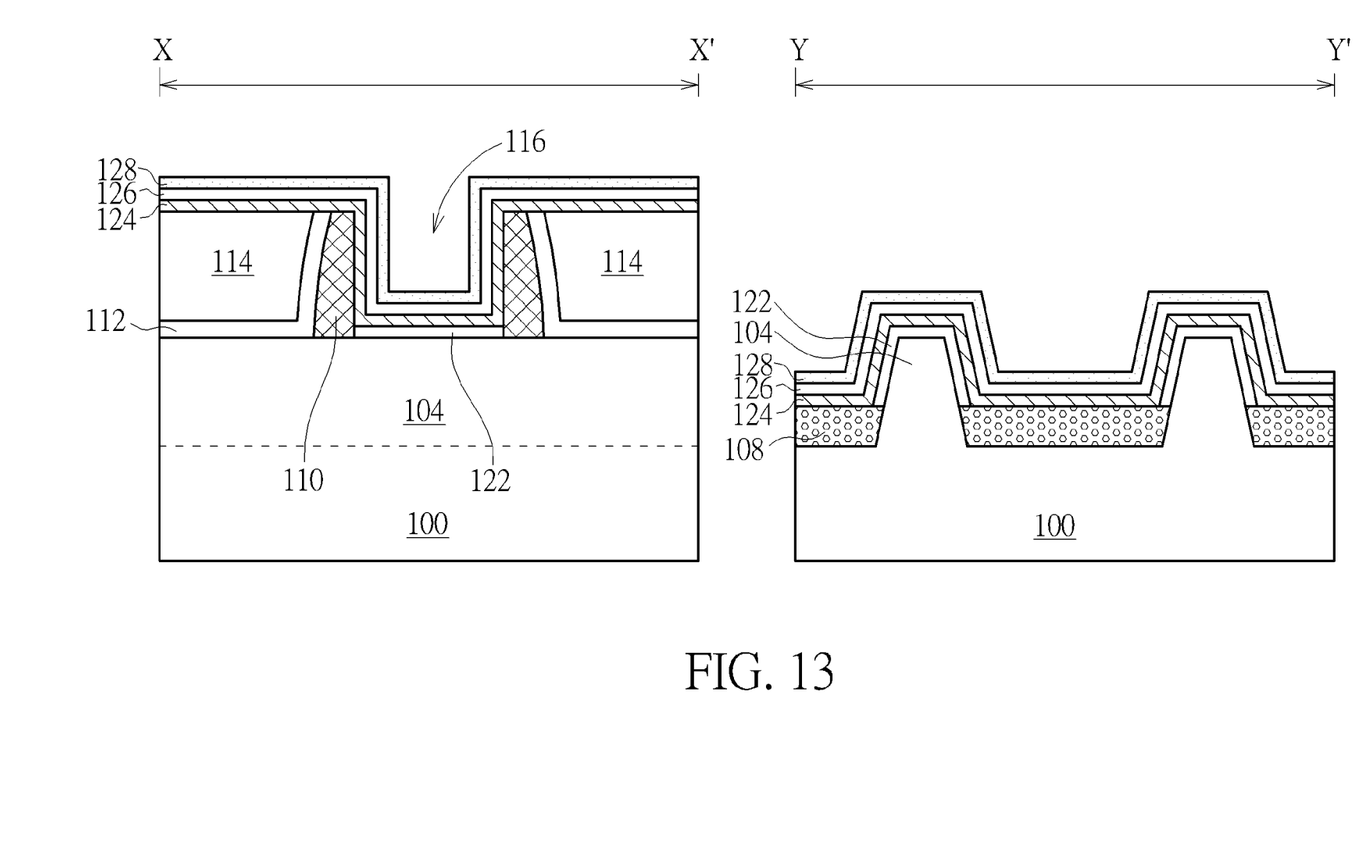
FIG. 13 is a schematic drawing in a step subsequent to FIG. 12.
Figure 14:
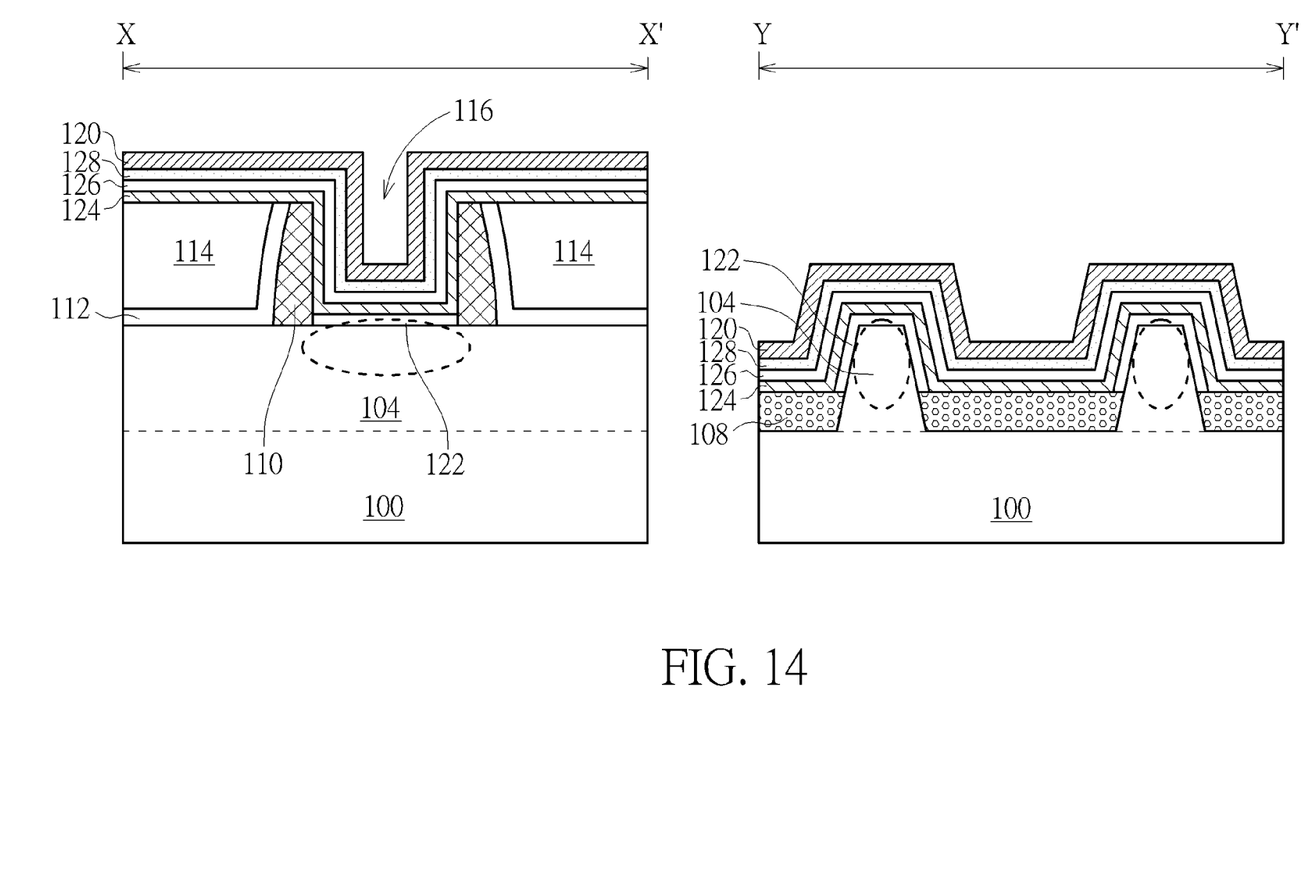
FIG. 14 is a schematic drawing in a step subsequent to FIG. 13.

Referring to FIG. 11 and FIG. 13, the STEP 58 is performed to form an oxygen-absorption material layer 128 in the gate trench 116, wherein the oxygen-absorption material layer 128 may be an amorphous silicon layer in this embodiment, but not limited thereto. Please refer to FIG. 14. Then, the stress film 120 is blanketly deposited on the substrate 100 to cover the bottom surface and the sidewall surface of the gate trench 116 in STEP 60. Sequentially, a PSA process is carried out, which is a thermal annealing process as mentioned in STEP 62. In this PSA process, not only the oxygen content in the BBM layer 126 is treated, but also the stress of the fin structures 104 is tuned, especially the part of the fin structures 104 disposed below the gate trench 116, to provide a stressed channel region (marked with the dotted circle). Therefore, the functions and effects of SMT process and the PSA process are both reached through the same thermal annealing process. The formation of the oxygen-absorption material layer 128 and the PSA process can be considered as an oxygen treatment process. It should be noted that a buffer layer may be optionally formed on the oxygen-absorption material layer 128, before forming the stress film 120. However, the buffer layer is not necessary in this embodiment since there is the oxygen-absorption material layer 128 existing between the BBM layer 126 and the stress film 120. Since the oxygen-absorption material layer 128 will be removed in a following process, it may serve as a sacrificial layer or a buffer layer, preventing the layers disposed underneath from damaging during the processes of forming the stress film 120, the thermal annealing process, and the subsequent removal process of the stress film 120, no matter the oxygen-absorption material layer 128 may be damaged in these processes.

Figure 15:
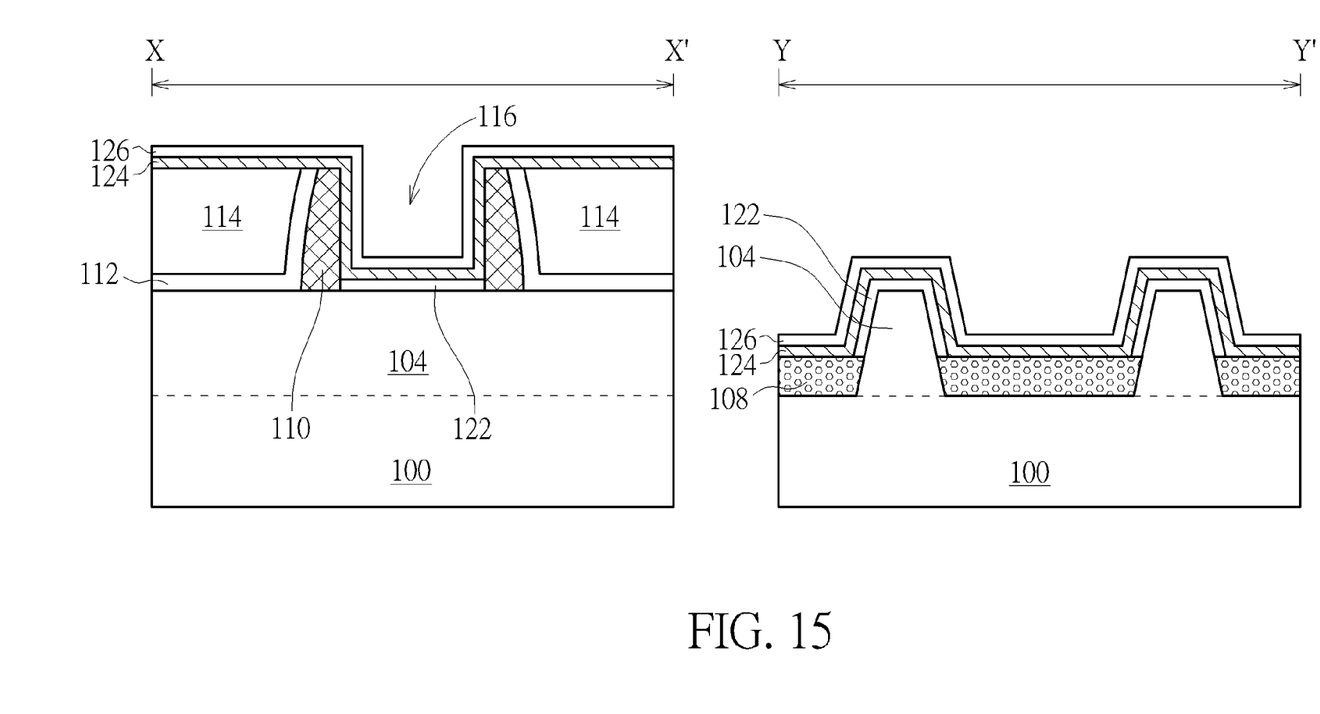
FIG. 15 is a schematic drawing in a step subsequent to FIG. 14.

Referring to FIG. 11 and FIG. 15, STEP 64 is then performed to sequentially remove the stress film 120 and the oxygen-absorption material layer 128 through dry etching process or wet etching process that is known by those skilled in the art. Therefore, the BBM layer 126 is exposed in the gate trench 116. After that, STEP 66 is performed. A work function metal layer may be deposited in the gate trench 116, and a metal gate is formed to fill the gate trench 116, as illustrate in FIG. 10 of the first preferred embodiment. Thus, the fabrication of the finFET 132 according to the second embodiment of the present invention is completed.

According to the present invention, the SMT process is carried out after the dummy gate is removed, therefore the stress film is directly formed in the gate trench, which is very close to the fin structure disposed below the gate trench since there may be only one or a few thin layers with about angstrom-grade thickness disposed therebetween. As a result, the SMT provides a superior effect for keeping the stress in the channel region. In addition, in the first embodiment of the present invention, the buffer layer could be removed together with the insulating layer, and therefore the removal process is simplified. Furthermore, in the second embodiment, only one thermal annealing process is carried out for performing the PSA process and the SMT process simultaneously, and therefore the heat affect is lowered. As a result, the present invention provides a method of fabricating the finFET with a stressed channel region to enhance mobility gain through simplified process, without inducing process variation and lowering the side effect of the SMT process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a fin field effect transistor (finFET), comprising:
    providing a substrate having at least one fin structure, a dummy gate, and an internal dielectric (ILD) layer thereon, wherein the dummy gate covers a portion of the fin structure;
    removing the dummy gate to form a gate trench on the fin structure, wherein a gate insulating layer is remained in the gate trench when removing the dummy gate;
    forming a buffer layer in the gate trench;
    after forming the buffer layer, blanketly forming a stress film on the substrate to cover a surface of the gate trench and a top surface of the fin structure;
    performing a thermal annealing process;
    removing the stress film;
    removing the buffer layer and the gate insulating layer simultaneously after removing the stress film; and
    forming a metal gate in the gate trench.

2. The method of fabricating the fin field effect transistor according to claim 1, further comprising forming a high-K dielectric layer on the surface of the gate trench after removing the dummy gate.

3. The method of fabricating the fin field effect transistor according to claim 2, wherein the high-K dielectric layer is formed after the stress film is removed and before the metal gate is formed.

4. The method of fabricating the fin field effect transistor according to claim 2, further comprising forming an interfacial layer on a bottom surface of the gate trench before forming the high-K dielectric layer.

5. The method of fabricating the fin field effect transistor according to claim 2, further comprising forming a bottom barrier metal (BBM) layer in the gate trench after forming the high-K dielectric layer.

6. The method of fabricating the fin field effect transistor according to claim 5, further comprising performing a decoupled plasma nitridation (DPN) process after forming the bottom barrier metal layer.

7. The method of fabricating the fin field effect transistor according to claim 5, further comprising:
    forming an oxygen-absorption material layer in the gate trench after forming the bottom barrier metal layer;
    performing an oxygen absorption process to enable the oxygen-absorption material layer to absorb oxygen from the bottom barrier metal layer; and
    removing the oxygen-absorption material layer.

8. The method of fabricating the fin field effect transistor according to claim 7, wherein the oxygen-absorption material layer comprises amorphous silicon material or carbon material.

9. The method of fabricating the fin field effect transistor according to claim 1, wherein the fin field effect transistor is an N-type field effect transistor.

10. The method of fabricating the fin field effect transistor according to claim 9, wherein the stress film is a tensile stress layer.

11. A method of fabricating a fin field effect transistor (finFET), comprising:
    providing a substrate having at least one fin structure, a dummy gate, and an internal dielectric (ILD) layer thereon, wherein the dummy gate covers a portion of the fin structure;
    removing the dummy gate to form a gate trench on the fin structure;
    forming a high-K dielectric layer on a surface of the gate trench after removing the dummy gate;
    forming a bottom barrier metal (BBM) layer in the gate trench after forming the high-K dielectric layer;
    forming an oxygen-absorption material layer in the gate trench after forming the bottom barrier metal layer, in order to enable the oxygen-absorption material layer to absorb oxygen from the bottom barrier metal layer in an oxygen absorption process;
    blanketly forming a stress film on the substrate to cover the surface of the gate trench and a top surface of the fin structure;
    performing a thermal annealing process;
    removing the stress film;
    removing the oxygen-absorption material layer after the oxygen absorption process; and
    forming a metal gate in the gate trench.

12. The method of fabricating the fin field effect transistor according to claim 11, wherein the high-K dielectric layer, the bottom barrier metal layer, and the oxygen-absorption material layer are formed before forming the stress film.

13. The method of fabricating the fin field effect transistor according to claim 12, wherein the oxygen absorption process is carried out through the thermal annealing process.

14. The method of fabricating the fin field effect transistor according to claim 11, wherein the oxygen-absorption material layer comprises amorphous silicon material or carbon material.

15. The method of fabricating the fin field effect transistor according to claim 11, wherein the fin field effect transistor is an N-type field effect transistor.

16. The method of fabricating the fin field effect transistor according to claim 15, wherein the stress film is a tensile stress layer.

* * * * *